(12) United States Patent
Tsuji et al.

(10) Patent No.: US 6,373,315 B2
(45) Date of Patent: Apr. 16, 2002

(54) SIGNAL POTENTIAL CONVERSION CIRCUIT

(75) Inventors: Takaharu Tsuji; Shigeki Tomishima; Tsukasa Ooishi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/793,997

(22) Filed: Feb. 28, 2001

(30) Foreign Application Priority Data

May 29, 2000 (JP) .......................... 12-157618

(51) Int. Cl.⁷ ............................................. H03L 5/00
(52) U.S. Cl. ..................... 327/333; 327/374; 326/62; 326/68; 326/80
(58) Field of Search ................................. 327/333, 374, 327/375, 376–7, 379, 380, 381, 427, 437; 326/62, 68, 80, 81, 83

(56) References Cited

U.S. PATENT DOCUMENTS

| 4,450,371 A | * | 5/1984 | Bismarck | 326/80 |
| 4,532,436 A | * | 7/1985 | Bismarck | 326/62 |
| 4,695,744 A | * | 9/1987 | Giordano | 327/333 |
| 5,854,561 A | * | 12/1998 | Arimoto et al. | 327/534 |
| 5,896,043 A | * | 4/1999 | Kumagai | 326/68 |

FOREIGN PATENT DOCUMENTS

JP    6-243680    9/1994

OTHER PUBLICATIONS

"A Study of Shared–Sense–Amp Control Circuit for DRAM", by Sakuma et al., 1992 Spring Convention of the Institute of Electronics Information and Communication Engineers, p. 5–248.

* cited by examiner

Primary Examiner—Kenneth B. Wells
Assistant Examiner—An T. Luu
(74) Attorney, Agent, or Firm—McDermott, Will & Emery (57) ABSTRACT

In a signal potential conversion circuit of a DRAM, a first P channel MOS transistor for charging a first node is connected in parallel with a second P channel MOS transistor and the second P channel MOS transistor is turned on in a pulse manner in response to a rising edge of an input signal. Further, the first P channel MOS transistor has its current drive ability defined to be approximately one-tenth of that of an N channel MOS transistor for discharging the first node. Accordingly, each of the first node and a second node can be charged and discharged quickly to enable conversion of a signal potential to be accomplished speedily.

15 Claims, 8 Drawing Sheets

SIGNAL POTENTIAL CONVERSION CIRCUIT

BACKGROUND OF THE INVENTION

1. Field of the Invention

The present invention relates to signal potential conversion circuits. In particular, the invention relates to a signal potential conversion circuit converting a first signal having one level of a first potential and the other level of a reference potential into a second signal hating one level of a second potential different from the first potential and the other level of the reference potential.

2. Description of the Background Art

A semiconductor integrated circuit device has been provided with a signal potential conversion circuit for converting a signal potential into another signal potential. For example, a dynamic random access memory (hereinafter referred to as DRAM) has memory cells each including an N channel MOS transistor for access and a capacitor for information storage. Data of "H" (logical high) level (power supply potential VDD) or "L" (logical low) level (ground potential GND) is written into the capacitor. Data is written into/read from the capacitor via the N channel MOS transistor. In data writing/reading, for the purpose of preventing voltage drop in the N channel MOS transistor, a boosted potential (VPP) higher than the supply potential VDD is applied to the gate of the N channel MOS transistor. Peripheral control circuitry for writing/reading of data is driven by the supply voltage VDD. Therefore, in order to transmit a signal from the peripheral control circuitry to a memory cell, a signal potential conversion circuit is required to convert the supply potential VDD into the boosted potential VPP.

Figure 10:
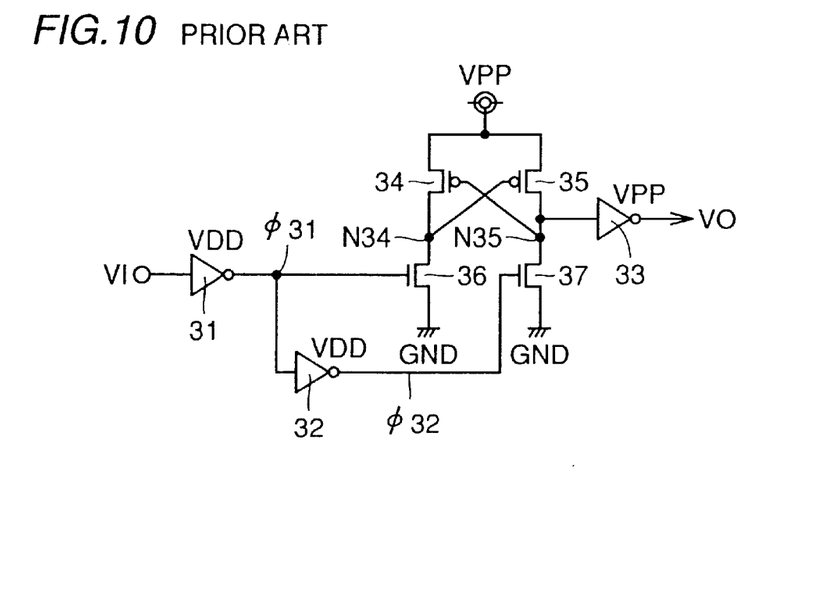
FIG. 10 is a circuit diagram showing a structure of a conventional signal potential conversion circuit.

FIG. 10 is a circuit diagram showing a structure of such a signal potential conversion circuit. Referring to FIG. 10, the signal potential conversion circuit includes inverters 31–33, P channel MOS transistors 34 and 35, and N channel MOS transistors 36 and 37.

P channel MOS transistors 34 and 35 are connected respectively between a line of the boosted potential VPP and nodes N34 and N35, having respective gates connected to nodes N35 and N34 respectively. N channel MOS transistors 36 and 37 are connected respectively between nodes N34 and N35 and a line of the ground potential GND. An input signal VI is supplied to the gate of N channel MOS transistor 36 via inverter 31 and supplied to the gate of N channel MOS transistor 37 via inverters 31 and 32. A signal appearing on node N35 is inverted by inverter 33 and output as an output signal VO.

Inverters 31 and 32 each include a P channel MOS transistor and an N channel MOS transistor connected in series between a line of the supply potential VDD and the line of the ground potential GND, outputting a signal of L level in response to input of a signal of H level and outputting a signal of H level in response to input of a signal of L level.

Inverter 33 includes a P channel MOS transistor and an N channel MOS transistor connected in series between the line of the boosted potential VPP and the line of the ground potential GND, outputting a signal of L level in response to input of a signal of the boosted potential VPP and outputting a signal of the boosted potential VPP in response to input of a signal of L level.

Figure 11:
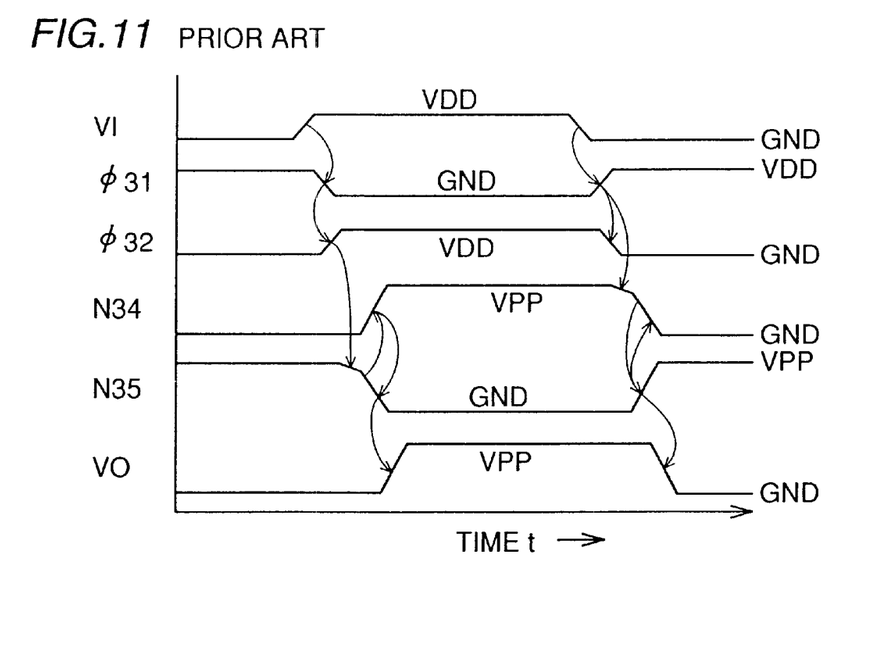
FIG. 11 is a timing chart showing an operation of the signal potential conversion circuit shown in FIG. 10.

FIG. 11 is a timing chart showing an operation of the signal potential conversion circuit shown in FIG. 10. In the initial state, input signal VI, an output signal φ32 from inverter 32, node N34 and output signal VO are all at L level, an output signal φ31 from inverter 31 is at H level and node N35 is at the boosted potential VPP. At this time, MOS transistors 35 and 36 are conductive while MOS transistors 34 and 37 are nonconductive.

When input signal VI rises from L level to H level at a certain time, signal φ31 falls to L level to turn off N channel MOS transistor 36 and signal φ32 rises to H level to turn on N channel MOS transistor 37. Accordingly, the potential on node N35 gradually decreases. When this potential becomes lower than VPP−|Vthp| (Vthp is the threshold voltage of the P channel MOS transistor), P channel MOS transistor 34 is turned on and node N34 rises to the boosted potential VPP. When node N34 reaches the boosted potential VPP, P channel MOS transistor 35 is turned off, node N35 falls to L level, and output signal VO rises to the boosted potential VPP.

Following this, when input signal VI falls from H level to L level, signal φ31 rises to H level to turn on N channel MOS transistor 36 and signal φ32 falls to L level to turn off N channel MOS transistor 37. Accordingly, the potential on node N34 gradually decreases. When this potential becomes lower than VPP−|Vthp|, P channel MOS transistor 35 is turned on and node N35 rises to the boosted potential VPP. When node N35 reaches the boosted potential VPP, P channel MOS transistor 34 is turned off, node N34 falls to L level, and output signal VO falls to L level.

In order to achieve reduced power consumption and enhanced speed of semiconductor integrated circuit devices, reduction of a power supply voltage thereof is now proceeding. Reduction of a power supply voltage of the DRAM is also in progress. However, reduction of the voltage for circuit components related to reading/writing of data from/into a memory cell cannot be promoted because of the necessity of maintaining a high-speed operation. Consequently, the difference between the voltage level of the peripheral control circuitry and the voltage level of the circuit components related to reading/writing of a memory cell is likely to become greater so that the difference between the input voltage VDD and the output voltage VPP of the signal potential conversion circuit tends to increase.

Regarding the conventional signal potential conversion circuit, node N34 should be charged to VPP−|Vthp| or higher for turning off P channel MOS transistor 35 when input signal VI rises from L level to H level. If the potential difference between the boosted potential VPP and the supply potential VDD becomes greater, the off level VPP−|Vthp| of N channel MOS transistor N35 becomes higher and accordingly charging of node N34 to VPP−|Vthp| takes a longer time. In other words, a problem of the conventional signal potential conversion circuit is that the increased difference between the input voltage VDD and the output voltage VPP prolongs the time required to convert a signal potential.

Although node N34 can be charged speedily by increasing the gate width of P channel MOS transistor 34 to enhance the current drive ability of P channel MOS transistor 34, discharging of node N34 to L level takes a longer time. Therefore, regarding the conventional signal potential conversion circuit, the time required for converting a signal potential cannot be shortened for both of the cases in which input signal VI rises from L level to H level and in which input signal VI falls from H level to L level.

SUMMARY OF THE INVENTION

One object of the present invention is accordingly to provide a signal potential conversion circuit capable of converting a signal potential speedily.

According to the present invention, a signal potential conversion circuit includes a discharge circuit discharging, in response to change of a first signal from a first potential to a reference potential, a first output node to the reference potential, the first output node provided for outputting a second signal, and discharging, in response to change of the first signal from the reference potential to the first potential, a second output node to the reference potential, the second output node provided for outputting a complementary signal of the second signal. The signal potential conversion circuit further includes a charge circuit including a first transistor and a second transistor having respective first electrodes both connected to a line of a second potential, respective second electrodes connected to the first and second output nodes respectively and respective input electrodes connected to the second and first output nodes respectively, the charge circuit charging to the second potential one of the first and second output nodes having a higher potential than that of the other output node. The signal potential conversion circuit further includes a third transistor of a first conductivity type connected between the line of the second potential and the second output node, and a first control circuit turning on the third transistor in a pulse manner in response to change of the first signal from the first potential to the reference potential. In this way, when the first signal changes from the first potential to the reference potential, the third transistor is turned on in a pulse manner to enable the second output node to be charged speedily. The third transistor is not turned on when the first signal changes from the reference potential to the first potential to enable the second output node to be discharged speedily. The second transistor can thus be controlled quickly and accordingly a speedily conversion of a signal potential is possible.

Preferably, the first control circuit turns on the third transistor when the first signal has the reference potential and the first output node has a potential higher than a predetermined third potential. In this case, the third transistor is turned on when the first signal has the reference potential while the potential on the first output node is still higher than the third potential.

More preferably, the first control circuit includes a first resistance element connected between the line of the second potential and an input electrode of the third transistor, a fourth transistor of a second conductivity type having its first electrode connected to the input electrode of the third transistor and its input electrode connected to the first output node and turned on when the first output node has a potential higher than the third potential, and a fifth transistor of the second conductivity type connected between a second electrode of the fourth transistor and a line of the reference potential and turned on when the first signal has the reference potential. In this case, when the first signal has the reference potential and the first output node has its potential higher than the third potential, the fourth and fifth transistors are turned on and the third transistor with its input electrode having the reference potential is turned on.

Still more preferably, a current level which the second transistor can flow is set sufficiently lower than a current level which the discharge circuit can flow. In this case, the second output node can more speedily be discharged when the first signal changes from the reference potential to the first potential.

Still more preferably, the signal potential conversion circuit further includes a sixth transistor of the first conductivity type connected between the line of the second potential and the first output node, and a second control circuit turning on the sixth transistor in a pulse manner in response to change of the first signal from the reference potential to the first potential. In this case, the first output node can speedily be charged since the sixth transistor is turned on in a pulse manner when the first signal changes from the reference potential to the first potential. Further, the first output node can quickly be discharged since the sixth transistor is not turned on when the first signal changes from the first potential to the reference potential. In this way, the second transistor clan quickly be controlled to enable conversion of a signal potential to be accomplished more speedily.

Still more preferably, the second control circuit turns on the sixth transistor when the first signal has the first potential and the second output node has a potential higher than a predetermined third potential. In this case, the sixth transistor is turned on when the second output node has a potential between the third potential and the second potential.

Still more preferably, the second control circuit includes a second resistance element connected between the line of the second potential and an input electrode of the sixth transistor, a seventh transistor of the second conductivity type having its first electrode connected to the input electrode of the sixth transistor and its input electrode connected to the second output node and turned on when the second output node has a potential higher than the third potential, and an eighth transistor of the second conductivity type connected between a second electrode of the seventh transistor and the line of the reference potential and turned on when the first signal has the first potential. In this case, when the first signal has the first potential and the second output node has a potential higher than the third potential, the seventh and eighth transistors are turned on and the sixth transistor with its input electrode having the reference potential is turned on.

Still more preferably, the first control circuit turns on the third transistor when the first signal has the reference potential and the second output node has a potential lower than a predetermined third potential. In this case, the third transistor is turned on when the first signal has the reference potential while the second output node has a potential which is still lower than the third potential.

Still more preferably, the first control circuit includes a first resistance element connected between the line of the second potential and the input electrode of the third transistor, a fourth transistor of the second conductivity type connected between the input electrode of the third transistor and the line of the reference potential, and a first logic circuit turning on the fourth transistor when the first signal has the reference potential and the second output node has a potential lower than the third potential. In this case, when the first signal has the reference potential and the second output node has a potential lower than the third potential, the fourth transistor is turned on and the third transistor with its input electrode having the reference potential is turned on.

Still more preferably, the signal potential conversion circuit further includes a fifth transistor of the first conductivity type connected between the line of the second potential and the first output node, and a second control circuit turning on the fifth transistor in a pulse manner in response to change of the first signal from the reference potential to the first potential. In this case, the fifth transistor is turned on in a pulse manner when the first signal changes from the reference potential to the first potential so that the first output node can be charged speedily. As the fifth transistor is not turned on when the first signal changes from the first potential to the reference potential, the first output node can be discharged quickly. In this way, speedy control of the second transistor is possible and thus conversion of a signal potential can be done more quickly.

Still more preferably, the second control circuit turns on the fifth transistor when the first signal has the first potential and the first output node has a potential lower than the third potential. In this case, the fifth transistor is turned on when the first signal has the first potential while the potential on the first output node is still lower than the third potential.

Still more preferably, the second control circuit includes a second resistance element connected between the line of the second potential and an input electrode of the fifth transistor, a sixth transistor of the second conductivity type connected between the input electrode of the fifth transistor and the line of the reference potential, and a second logic circuit turning on the sixth transistor when the first signal has the first potential and the first output node has a potential lower than the third potential. In this case, when the first signal has the first potential and the potential on the first output node is lower than the third potential, the sixth transistor is turned on and the fifth transistor with its input electrode having the reference potential is turned on.

Still more preferably, a current level which the first and second transistors each can flow is set sufficiently lower than a current level which the discharge circuit can flow. In this case, discharge of the first and second output nodes can be performed more quickly.

Still more preferably, the discharge circuit includes a ninth transistor of the second conductivity type connected between the first output node and the line of the reference potential and turned on when the first signal has the level of the reference potential, and a tenth transistor of the second conductivity type connected between the second output node and the line of the reference potential and turned on when the first signal has the level of the first potential. In this case, the discharge circuit can easily be constructed.

Still more preferably, the discharge circuit includes a ninth transistor of the second conductivity type connected between the first output node and the line of the reference potential and turned on when the first signal has the level of the reference potential, and a tenth transistor of the second conductivity type having a first electrode connected to the second output node, a second electrode receiving a complementary signal of the first signal and an input electrode receiving the first potential, and turned on when the first signal has the level of the first potential. In this case, a complementary signal of the first signal can be transmitted to the second output node.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
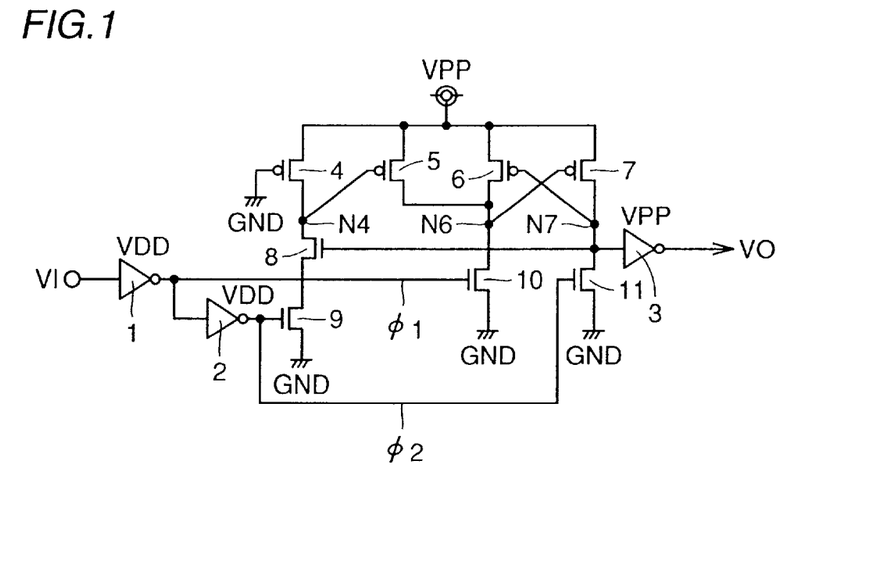
FIG. 1 is a circuit diagram showing a structure of a signal potential conversion circuit of a DRAM according to a first embodiment of the present invention.

FIG. 1 is a circuit diagram showing a structure of a signal potential conversion circuit of a DRAM according to the first embodiment of the invention. Referring to FIG. 1, the signal potential conversion circuit includes inverters 1–3, P channel MOS transistors 4–7 and N channel MOS transistors 9–11. P channel MOS transistors 4 and 6 each have a gate length which is set longer than that of other MOS transistors 5 and 7–11. P channel MOS transistors 4 and 6 each have current drive ability which is approximately one-tenth of current drive ability of other MOS transistors 5 and 7–11.

P channel MOS transistors 6 and 7 are connected respectively between a line of a boosted potential VPP and nodes N6 and N7, having respective gates connected to nodes N7 and N6 respectively. N channel MOS transistors 10 and 11 are connected respectively between nodes N6 and N7 and a line of a ground potential GND. P channel MOS transistors 4 and 5 are connected respectively between the line of the boosted potential VPP and nodes N4 and N6, having respective gates connected between the line of the ground potential GND and node N4. P channel MOS transistor 4 constitutes a resistance element. N channel MOS transistors 8 and 9 are connected in series between node N4 and the line of the ground potential GND. An input signal VI is supplied to the gate of N channel MOS transistor 10 via inverter 1 and supplied to respective gates of N channel MOS transistors 9 and 11 via inverters 1 and 2. A signal appearing on node N7 is input to the gate of N channel MOS transistor 8 and is inverted by inverter 3 to be output as an output signal VO.

Inverters 1 and 2 each include a P channel MOS transistor and an N channel MOS transistor connected in series between a line of a supply potential VDD and the line of the ground potential GND, outputting a signal of L level in response to input of a signal of H level and outputting a signal of H level in response to input of a signal of L level.

Inverter 3 includes a P channel MOS transistor and an N channel MOS transistor connected in series between the line of the boosted potential VPP and the line of the ground potential GND, outputting a signal of L level in response to input of a signal of the boosted potential VPP and outputting a signal of the boosted potential VPP in response to input of a signal of L level.

Figure 2:
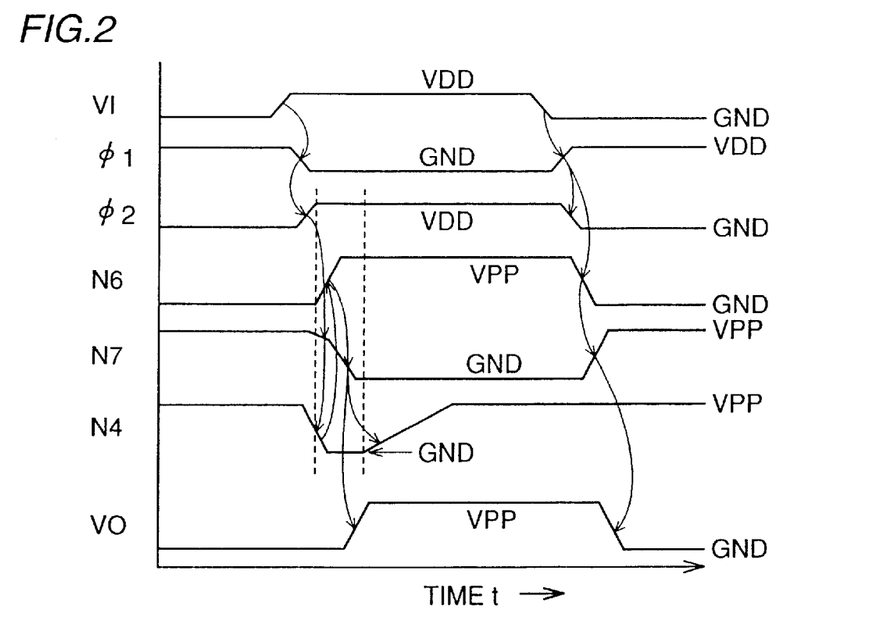
FIG. 2 is a timing chart showing an operation of the signal potential conversion circuit shown in FIG. 1.

FIG. 2 is a timing chart showing an operation of the signal potential conversion circuit shown in FIG. 1. In the initial state, input signal VI, an output signal φ2 of inverter 2, node N6 and output signal VO are all at L level, an output signal φ1 of inverter 1 is at H level, and nodes N4 and N7 are both at the boosted potential VPP. At this time, MOS transistors 7, 8 and 10 are conductive and MOS transistors 5, 6, 9 and 11 are nonconductive.

When input signal VI rises from L level to H level at a certain time, signal φ1 falls to L level so that N channel MOS transistor 10 is turned off and signal φ2 rises to H level so that N channel MOS transistors 9 and 11 are turned on. Although the potential on node N7 gradually decreases accordingly, N channel MOS transistor 8 is not turned off until the potential on node N7 decreases below Vthn (Vthn is a threshold voltage of the N channel MOS transistor). Therefore, the potential on node N4 falls from the boosted potential VPP to L level, P channel MOS transistor 5 is turned on and node N6 is charged to the boosted potential VPP. At this time, the potential on node N4 falls earlier than the potential on node N7. Then, compared with node N34 (corresponding to node N6) in the conventional circuit that is charged when the potential on node N35 (corresponding to node N7) falls to L level, node N6 (corresponding to node N34) can be charged more speedily.

When node N6 rises to the boosted potential VPP, P channel MOS transistor 7 is turned off, node N7 falls to L level, and output signal VO rises to the boosted potential VPP. In addition, when node N6 reaches the boosted potential VPP, N channel MOS transistor 8 is turned off, node N4 is charged to the boosted potential, and P channel MOS transistor 5 is turned off.

Following this, when input signal VI falls from H level to L level, signal φ1 rises to H level so that N channel MOS transistor 10 is turned on, and signal φ2 falls to L level so that N channel MOS transistors 9 and 11 are turned off. At this time, since P channel MOS transistor 6 has its current drive ability set to approximately one-tenth of that of N channel MOS transistor 10, it is possible to cause, compared with the conventional circuit in which P channel MOS transistor 34 and N channel MOS transistor 36 have approximately the same current drive ability, the potential on node N6 (corresponding to node 34) to fall to L level more speedily.

When the potential on node N6 falls to L level, P channel MOS transistor 7 is turned on, node N7 is charged to the boosted potential VPP, and output signal VO falls to L level. Although N channel MOS transistor 8 is turned on when the potential on node N7 rises to the boosted potential VPP, node N4 is maintained at the boosted potential VPP and P channel MOS transistor 5 remains turned off since N channel MOS transistor 9 is turned off.

According to the first embodiment, P channel MOS transistor 5 is turned on in a pulse manner when input signal VI rises from L level to H level, and consequently node N6 can be charged quickly. Further, since the current drive ability of P channel MOS transistor 6 is set low, node N6 can be discharged speedily when input signal VI falls from H level to L level. In this way, P channel MOS transistor 7 can be controlled quickly in both transitions of input signal VI from L level to H level and that from H level to L level, and accordingly, conversion of a signal potential can be accomplished at a high speed.

Figure 3:
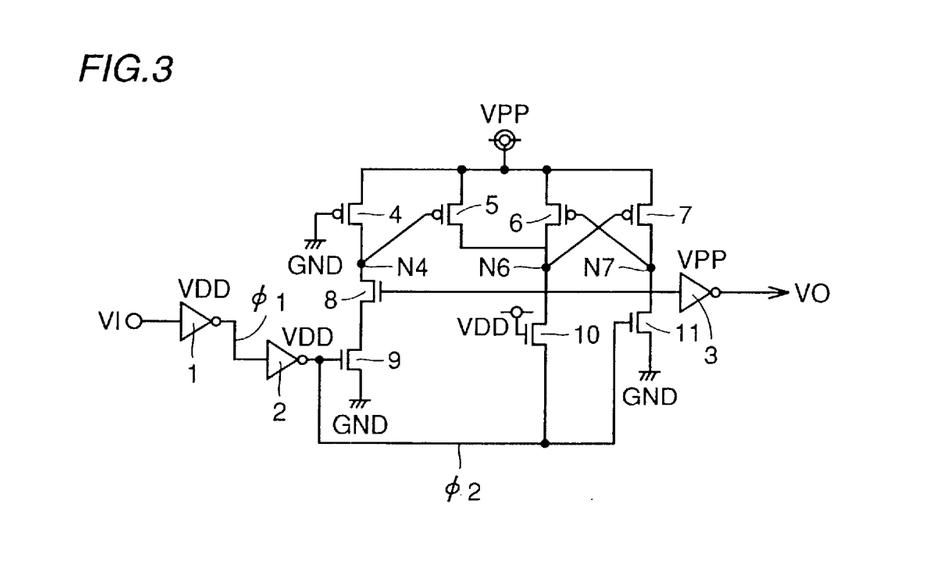
FIG. 3 is a circuit diagram showing a modification of the first embodiment.
Figure 4:
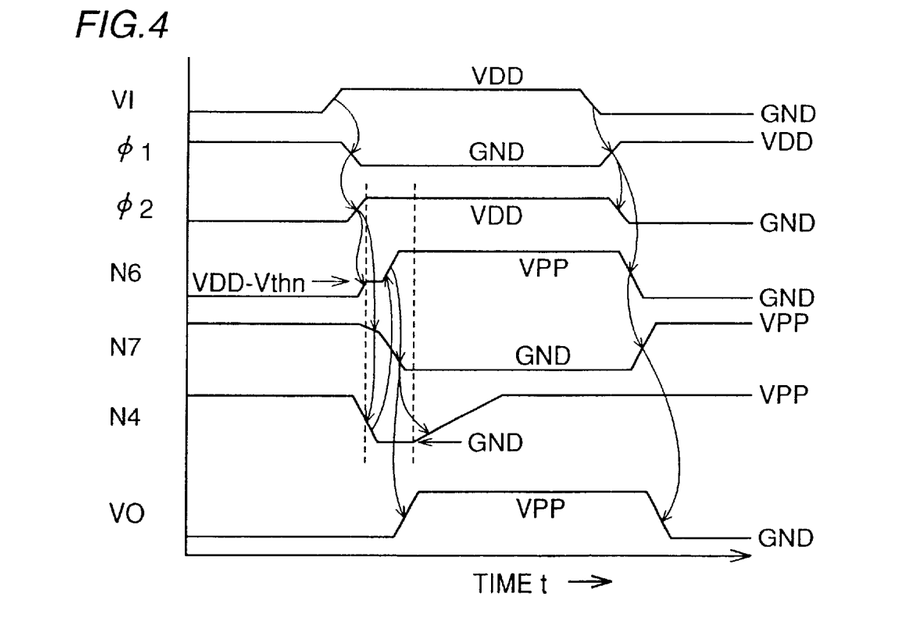
FIG. 4 is a timing chart showing an operation of a signal potential conversion circuit shown in FIG. 3.

Although signal φ1 is supplied to the gate of N channel MOS transistor 10 and its source is grounded, the supply potential VDD may be applied to the gate of N channel MOS transistor 10 and signal φ2 may be supplied to its source as shown in FIG. 3. In this case, node N6 can be raised by signal φ2 directly to VDD−Vthn as shown in FIG. 4.

Figure 5:
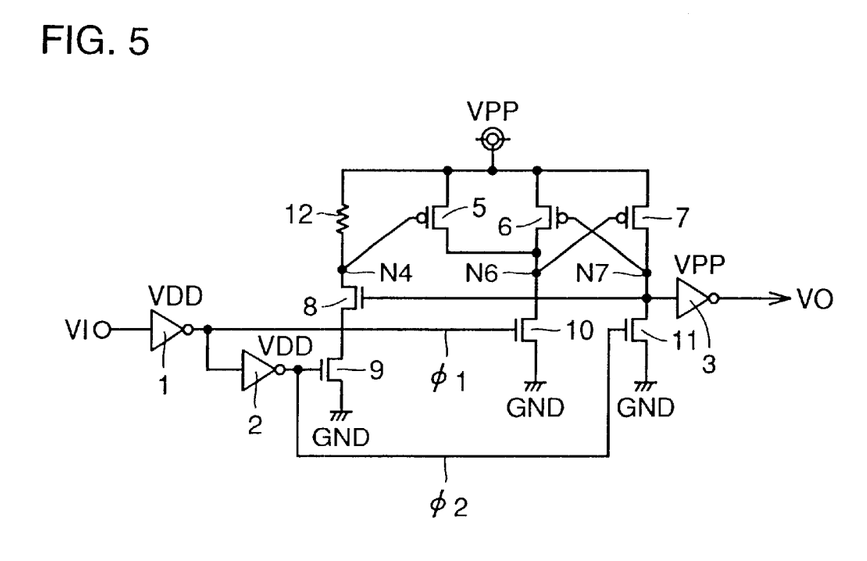
FIG. 5 is a circuit diagram showing another modification of the first embodiment.

As shown in FIG. 5, P channel MOS transistor 4 may be replaced with a resistance element 12. Resistance element 12 may be constituted of a polysilicon layer or of a diffusion layer.

Second Embodiment

Figure 6:
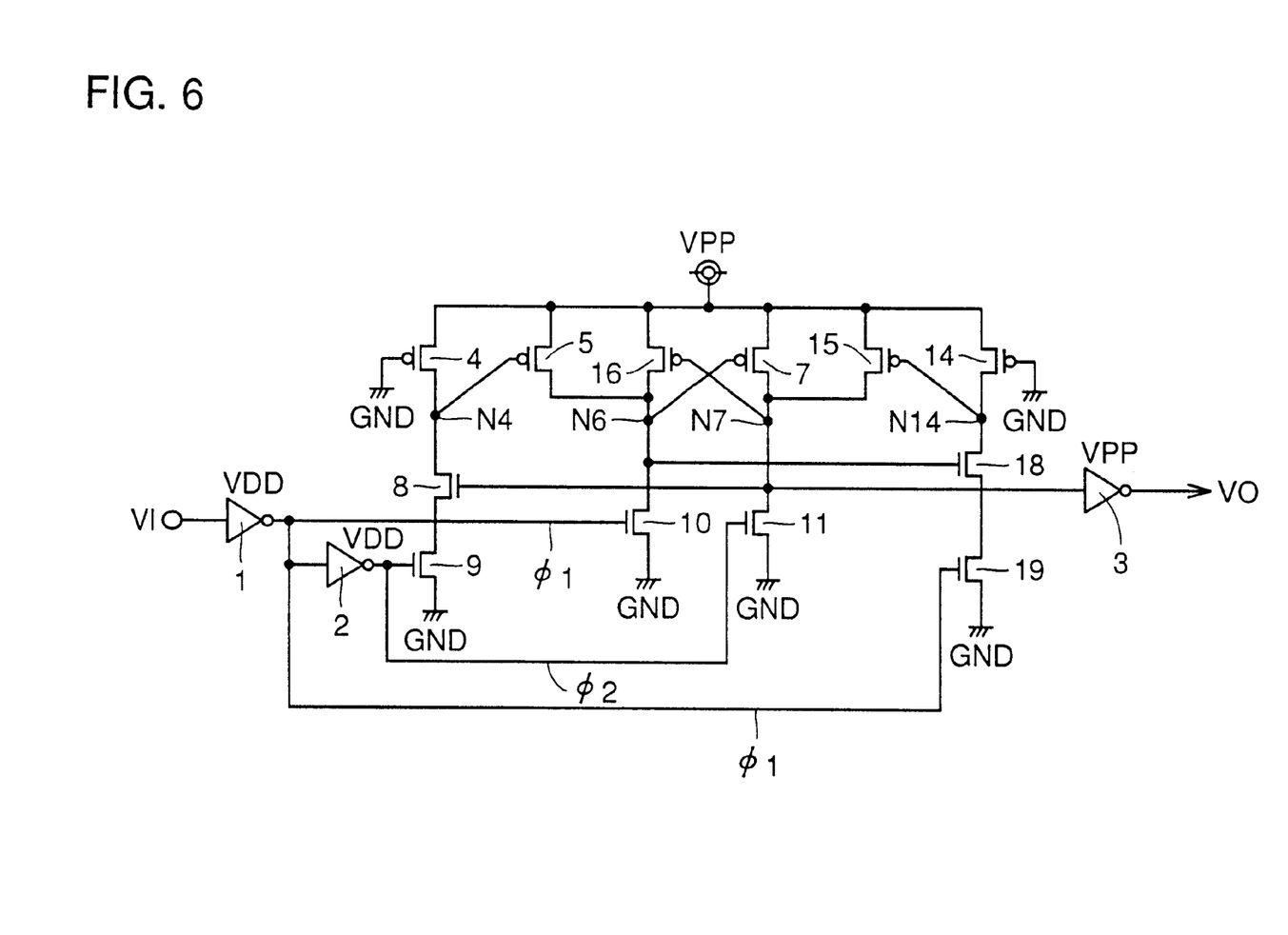
FIG. 6 is a circuit diagram showing a structure of a signal potential conversion circuit of a DRAM according to a second embodiment of the present invention.

FIG. 6 is a circuit diagram showing a structure of a signal potential conversion circuit of a DRAM according to the second embodiment of the invention. Referring to FIG. 6, this signal potential conversion circuit differs from the one shown in FIG. 1 in that P channel MOS transistor 6 is replaced with a P channel MOS transistor 16 and P channel MOS transistors 14 and 15 as well as N channel MOS transistors 18 and 19 are added. P channel MOS transistors 14 and 16 have respective gate lengths approximately equal to respective gate lengths of P channel MOS transistors 4 and 7. P channel MOS transistors 4 and 14 each have current drive ability which is approximately one-tenth of that of other MOS transistors 5, 7–11, 15, 16, 18 and 19.

P channel MOS transistor 16 is connected between a line of a boosted potential VPP and a node N6, having its gate connected to a node N7. P channel MOS transistors 14 and 15 are connected respectively between the line of the boosted potential VPP and nodes N14 and N7, having respective gates connected between a line of a ground potential GND and a node N14. P channel MOS transistor 14 constitutes a resistance element. N channel MOS transistors 18 and 19 are connected in series between node N14 and the line of the ground potential GND. N channel MOS transistor 18 has its gate connected to node N6 and N channel MOS transistor 19 has its gate receiving signal φ1.

Figure 7:
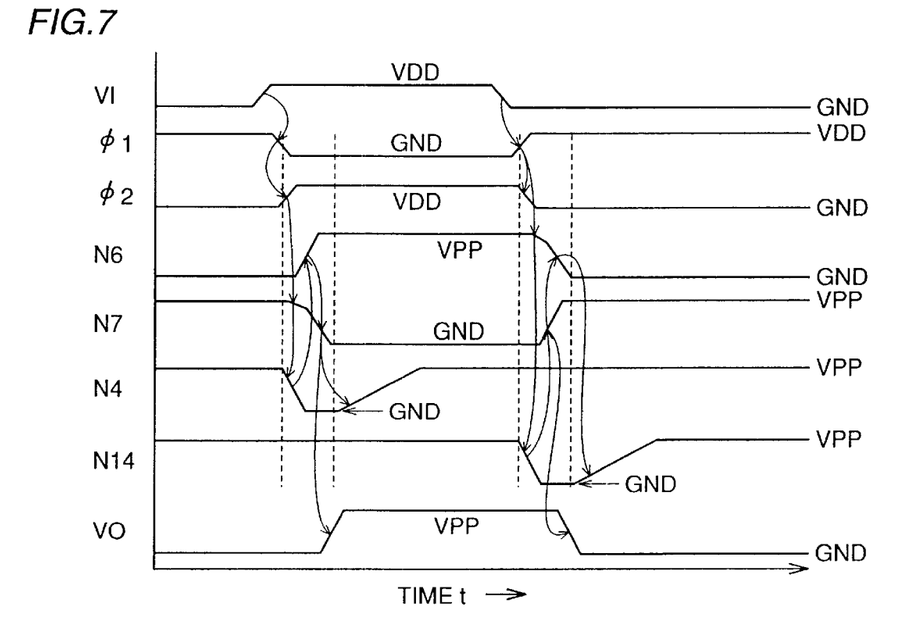
FIG. 7 is timing chart showing an operation of the signal potential conversion circuit shown in FIG. 6.

FIG. 7 is a timing chart showing an operation of the signal potential conversion circuit in FIG. 6. In the initial state, input signal VI, signal φ2, node N6 and output signal VO are all at L level, signal φ1 is at H level, and nodes N4, N7 and N14 are all at the boosted potential VPP. At this time, MOS transistors 7, 8, 10 and 19 are turned on and MOS transistors 5, 9, 11, 15 and 16 are turned off.

When input signal VI rises from L level to H level at a certain time, signal φ1 falls to L level to turn off N channel MOS transistors 10 and 19 and signal φ2 rises to H level to turn on N channel MOS transistors 9 and 11. Accordingly, the potential on node N7 gradually decreases. However, N channel MOS transistor 8 is not turned off until the potential on node N7 lowers below Vthn. The potential on node N4 thus falls from the boosted potential VPP to L level, P channel MOS transistor 5 is turned on and node N6 is charged to the boosted potential VPP.

When node N6 is charged to the boosted potential VPP, P channel MOS transistor 7 is turned off, node N7 falls to L level, and output signal VO rises to the boosted potential VPP. Further, when node N6 is charged to the boosted potential VPP, N channel MOS transistor 18 is turned on, N channel MOS transistor 8 is turned off, node N4 is charged to the boosted potential VPP and P channel MOS transistor 5 is turned off.

When input signal VI then falls from H level to L level, signal φ1 rises to H level to turn on N channel MOS transistors 10 and 19, and signal φ2 falls to L level to turn off N channel MOS transistors 9 and 11. Accordingly, the potential on node N6 gradually decreases. However, N channel MOS transistor 18 is not turned off until the potential on node N6 lowers below Vthn. Then, the potential on node N14 falls from the boosted potential VPP to L level, P channel MOS transistor 15 is turned on, node N7 is charged to the boosted potential VPP and output signal VO falls to L level. When node N7 is charged to the boosted potential VPP, P channel MOS transistor 16 is turned off so that node N6 falls to L level and N channel MOS transistor 18 is turned off so that node N14 is charged to the boosted potential VPP. Further, P channel MOS transistor 15 is turned off.

According to the second embodiment, P channel MOS transistor 5 is turned on in a pulse manner when input signal VI changes from L level to H level, and P channel MOS transistor 15 is turned on in a pulse manner when input signal VI changes from H level to L level. Therefore, nodes N6 and N7 can be charged and discharged speedily and accordingly a signal potential can be converted quickly. Further, the time period from transition of input signal VI from L level to H level to transition of output signal VO from L level to the boosted potential VPP can be made equal to the time period from transition of input signal VI from H level to L level to transition of output signal VO from the boosted potential VPP to L level.

Third Embodiment

Figure 8:
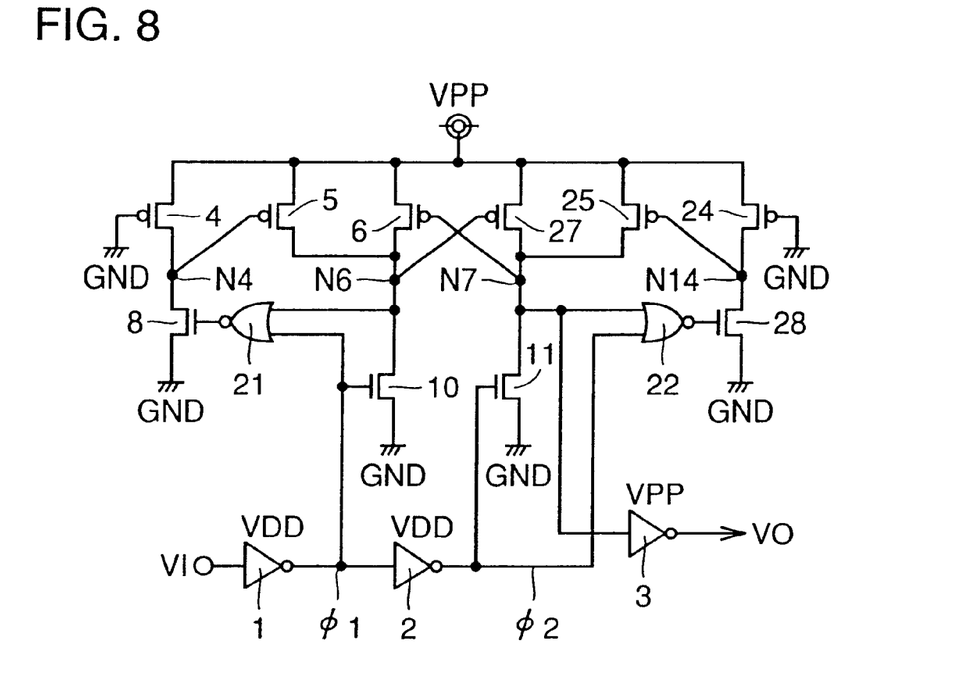
FIG. 8 is a circuit diagram showing a structure of a signal potential conversion circuit of a DRAM according to a third embodiment of the present invention.

FIG. 8 is a circuit diagram showing a structure of a signal potential conversion circuit of a DRAM according to the third embodiment of the invention. Referring to FIG. 8, this signal potential conversion circuit differs from the one shown in FIG. 1 in that N channel MOS transistor 9 is eliminated, P channel MOS transistor 7 is replaced with a P channel MOS transistor 27, and NOR gates 21 and 22, P channel MOS transistors 24 and 25 and an N channel MOS transistor 28 are added. P channel MOS transistors 27 and 24 have respective gate lengths set approximately equal to those of P channel MOS transistors 6 and 4 respectively. P channel MOS transistors 4, 6, 24 and 27 each have current drive ability which is approximately one-tenth of that of MOS transistors 5, 8, 10, 11, 25 and 28.

The source of N channel MOS transistor 8 is directly grounded. P channel MOS transistor 2 7 is connected between a line of a boosted potential VPP and a node N7, having its gate connected to a node N6. P channel MOS transistors 24 and 25 are connected respectively between the line of the boosted potential VPP and nodes N14 and N7, having respective gates connected between a line of a ground potential GND and node N14. N channel MOS transistor 24 constitutes a resistance element. N channel MOS transistor 28 is connected between node N 14 and the line of the ground potential GND. NOR gate 21 receives signal φ1 and a signal appearing on node N6 and outputs a signal to be supplied to the gate of N channel MOS transistor 8. NOR gate 22 receives signal φ2 and a signal appearing on node N7 and outputs a signal to be supplied to the gate of N channel MOS transistor 28.

Figure 9:
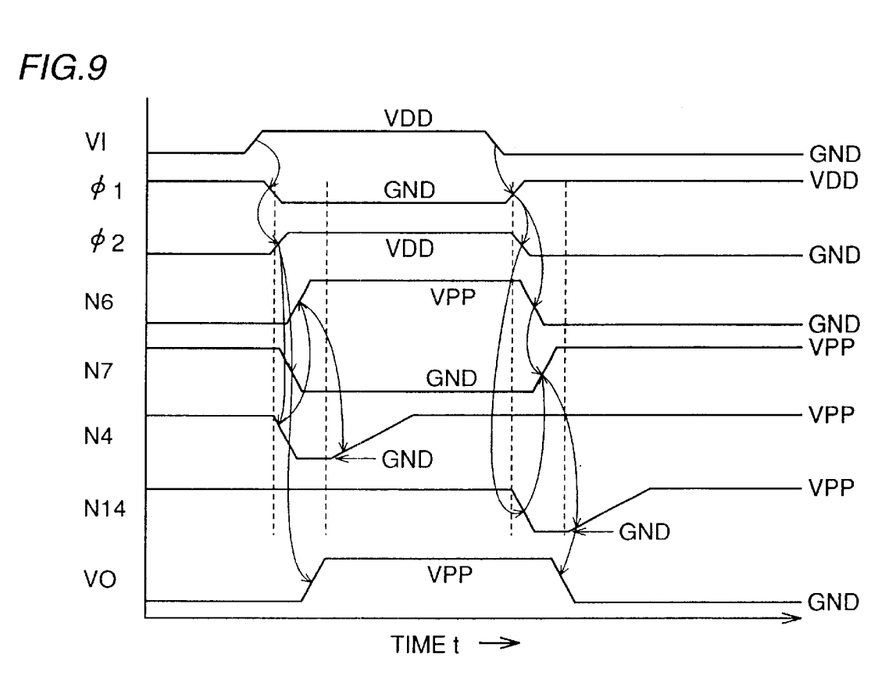
FIG. 9 is a timing chart showing an operation of the signal potential conversion circuit shown in FIG. 8.

FIG. 9 is a timing chart showing an operatiosn of the signal potential conversion circuit in FIG. 8. In the initial state, input signal VI, signal φ2, node N6 and output signal VO are all at L level, signal φ1 is at H level, and nodes N4, N7 and N14 are all at the boosted potential VPP. At this time, MOS transistors 10 and 27 are turned on and MOS transistors 5, 6, 8, 11, 25 and 28 are turned off.

When input signal VI rises from L level to H level at a certain time, signal φ1 falls to L level, signal φ2 rises to H level, N channel MOS transistor 11 is turned on to cause node N7 to fall to L level, and output signal VO rises to the boosted potential VPP. As P channel MOS transistor 27 has its current drive ability set to approximately one-tenth of that of P channel MOS transistor 11, node N7 quickly falls to L level.

When signal φ1 falls to L level, N channel MOS transistor 10 is turned off. However, the potential on node NG increases slowly since the current drive ability of P channel MOS transistor 6 is low. Accordingly, an output signal of NOR gate 21 rises to H level to turn on N channel MOS transistor 8, node N4 falls to L level to turn on P channel MOS transistor 5, and node N6 is quickly charged to the boosted potential VPP. When node N6 is charged to the boosted potential VPP, P channel MOS transistor 27 is turned off, the output signal of NOR gate 21 falls to L level to turn off N channel MOS transistor 8, and node N4 rises to the boosted potential VPP to turn off P channel MOS transistor 5.

Following this, when input signal VI falls from H level to L level, signal φ1 rises to H level to turn on N channel MOS transistor 10 and signal φ2 falls to L level to turn off N channel MOS transistor 11. Because of the low current drive ability of P channel MOS transistors 6 and 27, node N6 speedily falls to L level while the potential on node N7 increases slowly. Accordingly, an output signal of NOR gate 22 rises to H level to turn on N channel MOS transistor 28, node N14 falls to L level to turn on P channel MOS transistor 25, and node N7 is quickly charged. When node N7 is charged to the boosted potential VPP, output signal VO falls to L level, the output signal of NOR gate 22 falls to L level to turn off N channel MOS transistor 28, and node N14 rises to the boosted potential VPP to turn off P channel MOS transistor 25.

According to the third embodiment, because of the low current drive ability of P channel MOS transistor 27, node N7 can speedily be discharged when input signal VI rises from L level to H level. Further, when input signal VI falls from H level to L level, node N7 can be charged quickly because P channel MOS transistor 25 is turned on in a pulse manner. Conversion of a signal potential can be performed quickly in both of the cases in which input signal VI changes from L level to H level and in which input signal VI changes from H level to L level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal potential conversion circuit converting a first signal having one level of a first potential and the other level of a reference potential into a second signal having one level of a second potential different from said first potential and the other level of said reference potential, comprising:

first and second output nodes for outputting said second signal and a complementary signal of the second signal respectively;

a discharge circuit discharging said first output node to said reference potential in response to change of said first signal from said first potential to said reference potential and discharging said second output node to said reference potential in response to change of said first signal from said reference potential to said first potential;

a charge circuit including first and second transistors of a first conductivity type having respective first electrodes both connected to a line of said second potential, respective second electrodes connected to said first and second output nodes respectively and respective input electrodes connected to said second and first output nodes respectively, and charging to said second potential one of said first and second output nodes having a potential higher than that of the other output node;

a third transistor of the first conductivity type connected between the line of said second potential and said second output node; and a first control circuit turning on said third transistor in a pulse manner in response to change of said first signal from said first potential to said reference potential.

2. The signal potential conversion circuit according to claim 1, wherein
said first control circuit turns on said third transistor when said first signal has said reference potential and said first output node has its potential higher than a predetermined third potential.

3. The signal potential conversion circuit according to claim 2, wherein
said first control circuit includes:
a first resistance element connected between the line of said second potential and an input electrode of said third transistor;
a fourth transistor of a second conductivity type having a first electrode connected to the input electrode of said third transistor and an input electrode connected to said first output node and turned on when said first output node has its potential higher than said third potential; and
a fifth transistor of the second conductivity type connected between a second electrode of said fourth transistor and a line of said reference potential and turned on when said first signal has said reference potential.

4. The signal potential conversion circuit according to claim 1, wherein
a current level which said second transistor can flow is set sufficiently lower than a current level which said discharge circuit can flow.

5. The signal potential conversion circuit according to claim 1, further comprising:
a sixth transistor of the first conductivity type connected between the line of said second potential and said first output node; and
a second control circuit turning on said sixth transistor in a pulse manner in response to change of said first signal from said reference potential to said first potential.

6. The signal potential conversion circuit according to claim 5, wherein
said second control circuit turns on said sixth transistor when said first signal has said first potential and said second output node has its potential higher than a predetermined third potential.

7. The signal potential conversion circuit according to claim 6, wherein
said second control circuit includes:
a second resistance element connected between the line of said second potential and an input electrode of said sixth transistor;
a seventh transistor of a second conductivity type having a first electrode connected to the input electrode of said sixth transistor and an input electrode connected to said second output node and turned on when said second output node has its potential higher than said third potential; and
an eighth transistor of the second conductivity type connected between a second electrode of said seventh transistor and a line of said reference potential and turned on when said first signal has said first potential.

8. The signal potential conversion circuit according to claim 1, wherein
said first control circuit turns on said third transistor when said first signal has said reference potential and said second output node has its potential lower than a predetermined third potential.

9. The signal potential conversion circuit according to claim 8, wherein
said first control circuit includes:
a first resistance element connected between the line of said second potential and an input electrode of said third transistor;

a fourth transistor of a second conductivity type connected between the input electrode of said third transistor and a line of said reference potential; and
a first logic circuit turning on said fourth transistor when said first signal has said reference potential and said second output node has its potential lower than said third potential.

10. The signal potential conversion circuit according to claim 8, further comprising:
a fifth transistor of the first conductivity type connected between the line of said second potential and said first output node; and
a second control circuit turning on said fifth transistor in a pulse manner in response to change of said first signal from said reference potential to said first potential.

11. The signal potential conversion circuit according to claim 10, wherein
said second control circuit turns on said fifth transistor when said first signal has said first potential and said first output node has its potential lower than said third potential.

12. The signal potential conversion circuit according to claim 11, wherein
said second control circuit includes:
a second resistance element connected between the line of said second potential and an input electrode of said fifth transistor;
a sixth transistor of a second conductivity type connected between the input electrode of said fifth transistor and a line of said reference potential; and
a second logic circuit turning on said sixth transistor when said first signal has said first potential and said first output node has its potential lower than said third potential.

13. The signal potential conversion circuit according to claim 10, wherein
a current level which said first and second transistors each can flow is set sufficiently lower than a current level which said discharge circuit can flow.

14. The signal potential conversion circuit according to claim 1, wherein
said discharge circuit includes:
a ninth transistor of a second conductivity type connected between said first output node and a line of said reference potential and turned on when said first signal has the level of said reference potential; and
a tenth transistor of the second conductivity type connected between said second output node and the line of said reference potential and turned on when said first signal has the level of said first potential.

15. The signal potential conversion circuit according to claim 1, wherein
said discharge circuit includes:
a ninth transistor of a second conductivity type connected between said first output node and a line of said reference potential and turned on when said first signal has the level of said reference potential; and
a tenth transistor of the second conductivity type having a first electrode connected to said second output node, a second electrode receiving a complementary signal of said first signal and an input electrode receiving said first potential, and turned on when said first signal has the level of said first potential.

* * * * *